(12) United States Patent
McQuilkin (10) Patent No.: US 11,125,817 B2
(45) Date of Patent: Sep. 21, 2021

(54) COMPOUND PIN DRIVER

(71) Applicant: Analog Devices, Inc., Norwood, MA (US)

(72) Inventor: Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 179 days.

(21) Appl. No.: 16/600,917

(22) Filed: Oct. 14, 2019

(65) Prior Publication Data

US 2021/0109155 A1 Apr. 15, 2021

(51) Int. Cl.
| | | |
|---|---|---|
| *H04K 1/02* | (2006.01) | |
| *H04L 25/03* | (2006.01) | |
| *H04L 25/49* | (2006.01) | |
| *G01R 31/317* | (2006.01) | |
| *H03F 3/21* | (2006.01) | |
| *G01R 31/3177* | (2006.01) | |
| *H03G 3/30* | (2006.01) | |

(52) U.S. Cl.
CPC ... *G01R 31/31721* (2013.01); *G01R 31/3177* (2013.01); *H03F 3/21* (2013.01); *H03G 3/30* (2013.01); *H03G 2201/103* (2013.01); *H03G 2201/502* (2013.01)

(58) Field of Classification Search
CPC ........ G01R 31/31721; G01R 31/31924; G01R 1/30; G01R 31/3177; H03F 3/21; H03F 3/45645; H03F 1/3205; H03G 3/30; H03G 2201/502; H03G 2201/103
USPC ........................................ 375/297, 295, 224
See application file for complete search history.

(56) References Cited

U.S. PATENT DOCUMENTS

| | | | |
|---|---|---|---|
| 5,270,660 A * | 12/1993 | Werner, Jr. | ............... G01R 1/30 324/452 |
| 5,493,519 A | 2/1996 | Allen, III | |
| 5,942,922 A * | 8/1999 | Dinteman | ........ G01R 31/31924 327/108 |
| 6,292,010 B1 | 9/2001 | Persons et al. | |
| 6,294,949 B1 | 9/2001 | Kojima et al. | |
| 6,377,051 B1 | 4/2002 | Tyner et al. | |
| 6,642,734 B1 | 11/2003 | Tsuyuki et al. | |

(Continued)

OTHER PUBLICATIONS

Ichiyama, Kiyotaka, et al., "A Functional Test of 2-GHz/4-GHz RF Digital Communication Device Using Digital Tester", IEEE International Test Conference (ITC), (2013), 10 pgs.

*Primary Examiner* — Phuong Phu
(74) *Attorney, Agent, or Firm* — Schwegman Lundberg & Woessner, P.A.

(57) ABSTRACT

A test system can use first and different second driver stages to provide test signals to a device under test (DUT). A compound stage can receive signals from the driver stages and provide a voltage output signal to the DUT, such as via a gain circuit. The compound stage can include a buffer circuit configured to provide a first portion of the voltage output signal based on a first output signal from the first driver stage, and the compound stage can include a transimpedance circuit configured to provide a second portion of the voltage output signal based on a second output signal from the second driver stage. In an example, the gain circuit can receive a superposition signal comprising the first and second portions of the voltage output signal and, in response, provide a test signal to the DUT.

20 Claims, 5 Drawing Sheets

(56) References Cited

U.S. PATENT DOCUMENTS

| | | | |
|---|---|---|---|
| 6,677,775 B2 | 1/2004 | Babcock | |
| 6,703,825 B1 | 3/2004 | Creek et al. | |
| 6,856,129 B2 | 2/2005 | Thomas et al. | |
| 7,102,375 B2 | 9/2006 | Walker et al. | |
| 7,248,035 B2 | 7/2007 | Babcock et al. | |
| 7,268,573 B2 | 9/2007 | Jang et al. | |
| 7,589,549 B2 * | 9/2009 | Kamo | G01R 31/31924 324/750.3 |
| 7,755,377 B2 * | 7/2010 | Kamo | G01R 31/31924 324/764.01 |
| 8,922,271 B1 | 12/2014 | Moothedath et al. | |
| 10,180,453 B2 | 1/2019 | King | |
| 2007/0096817 A1 * | 5/2007 | Sutardja | H03F 3/45645 330/253 |
| 2016/0006395 A1 * | 1/2016 | Kim | H03F 1/3205 330/261 |

\* cited by examiner

COMPOUND PIN DRIVER

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a common 50 ohm resistor, which is then connected to the DUT node. In this way, transitions between the three levels can be realized by opening and closing the appropriate switches, such as with only one switch closed at any given time.

A feature of ATE test systems is an ability to deliver precisely timed Vhigh, Vlow, and Vterm signals or transitions to the DUT. It can be critical for a test system to provide substantially constant propagation delays and predictable signal edge placement independent of variables like temperature, frequency, duty cycle, pulse width or test vector history that can compromise efficacy of a test system.

BRIEF SUMMARY

The present inventor has recognized, among other things, that a problem to be solved includes providing a test signal generator system that is relatively small, inexpensive to produce, consumes less power than traditional systems, or provides higher fidelity performance relative to traditional systems. For example, the problem can include providing a test signal generator with improved pulse edge placement accuracy or improved bandwidth characteristics.

In an example, a solution to these and other problems can include a driver system with a compound stage. The compound stage can accommodate a large range of voltage and current input and output signals, and can support high bandwidth signals with improved accuracy. In an example, the compound stage can include a first input that can receive voltage signals and can include a second input that can receive current signals, and can provide a compound output signal based on a combination of the received voltage and current signals. In an example, a test system that includes the compound stage can have power handling characteristics similar to those of a class AB driver and can have bandwidth characteristics similar to those of a class A driver.

In an example, the compound stage provides a high impedance environment and thus devices used in a front-end switching or driver circuit can be many times smaller than devices that would be used in a traditional class A switching circuit. Furthermore, since switching operations can be performed inside the high impedance environment of the compound stage, front-end switching current signals can be many times smaller than current signals that would be used in a traditional class A switching circuit.

In an example, the compound stage can also help isolate front-end driver or switching stages from a DUT. With the improved isolation over traditional driver arrangements, parasitic loading effects can be reduced and bandwidth can be improved. Accordingly, smaller or fewer capacitance-cancelling devices can be used, or can be omitted altogether.

This Summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A pin driver circuit of a test system can provide a voltage pulse stimulus to a device under test (Duo at a specified time, and optionally measures a response from the DUT. The test system can be configured to provide high fidelity output signal pulses over a relatively large output signal magnitude range to accommodate different types of devices under test. In some examples, a test system includes a physically large current switching stage to facilitate large voltage swings. Such a large current switching stage, however, can present a liability for producing small voltage swings because spurious signals, such as due to parasitic effects associated with a physically large switching stage that can detract from test signal waveform fidelity and test signal bandwidth.

The test systems and methods described herein provide, among other things, a pin driver architecture that can improve pulse edge placement accuracy and signal bandwidth at high or low power operating levels. In an example, the systems described herein can include a compound stage to receive and combine signals from multiple different driver circuits before providing the signals to a DUT. In an example, the compound stage can include a voltage signal amplifier circuit, such as configured to receive and process signals from a class AB driver stage, and a transimpedance circuit, such as configured to receive and process signals from a class A driver stage. Additionally driver stages, or multiple instances of one or more types of driver stages, can optionally be used together with the compound stage discussed herein.

In an example, multiple drivers or driver stages can be used to provide a test system that is configurable to test a variety of semiconductor devices with varying voltage and speed requirements. Furthermore, multiple drivers can be used to enhance or enable multiple signal level testing or "multiplexing" for physical layer testing. During physical layer testing, the multiple drivers can be switched concurrently to provide various different stimuli or drive signals to a DUT.

In an example, a class AB driver can be configured to deliver a large range of different voltage magnitude signals and can be configured to consume a minimum amount of power. The class AB driver can have moderate bandwidth and timing accuracy. The class AB driver can include or use diode bridges, differential pairs of transistors, or other switching elements. In an example, a class AB driver can be configured for moderate speed testing of system-on-a-chip circuits or other circuits or devices.

In an example, a class A driver can be configured to deliver relatively low magnitude current signals and can be configured for high bandwidth and timing accuracy. In an example, a class A driver can be configured to switch larger current signals, for example, directly at an output node of the driver or at the input of the DUT. In an example, a class A driver can be configured for high speed testing of memory circuits or other devices. In an example, a class A driver can reduce an overall bandwidth of a test system because of its parasitic loading on the DUT, for example, due to large constituent devices that are used to switch large current signals at the DUT. In an example, some test systems can include capacitance-cancellation elements to counteract loading effects of the class A driver, however, such elements can be physically large and can contribute to increased part size and die cost. In an example, a compound stage, as discussed herein, can be used together with a smaller class A driver to reduce or eliminate a need for such cancellation elements.

Figure 1:
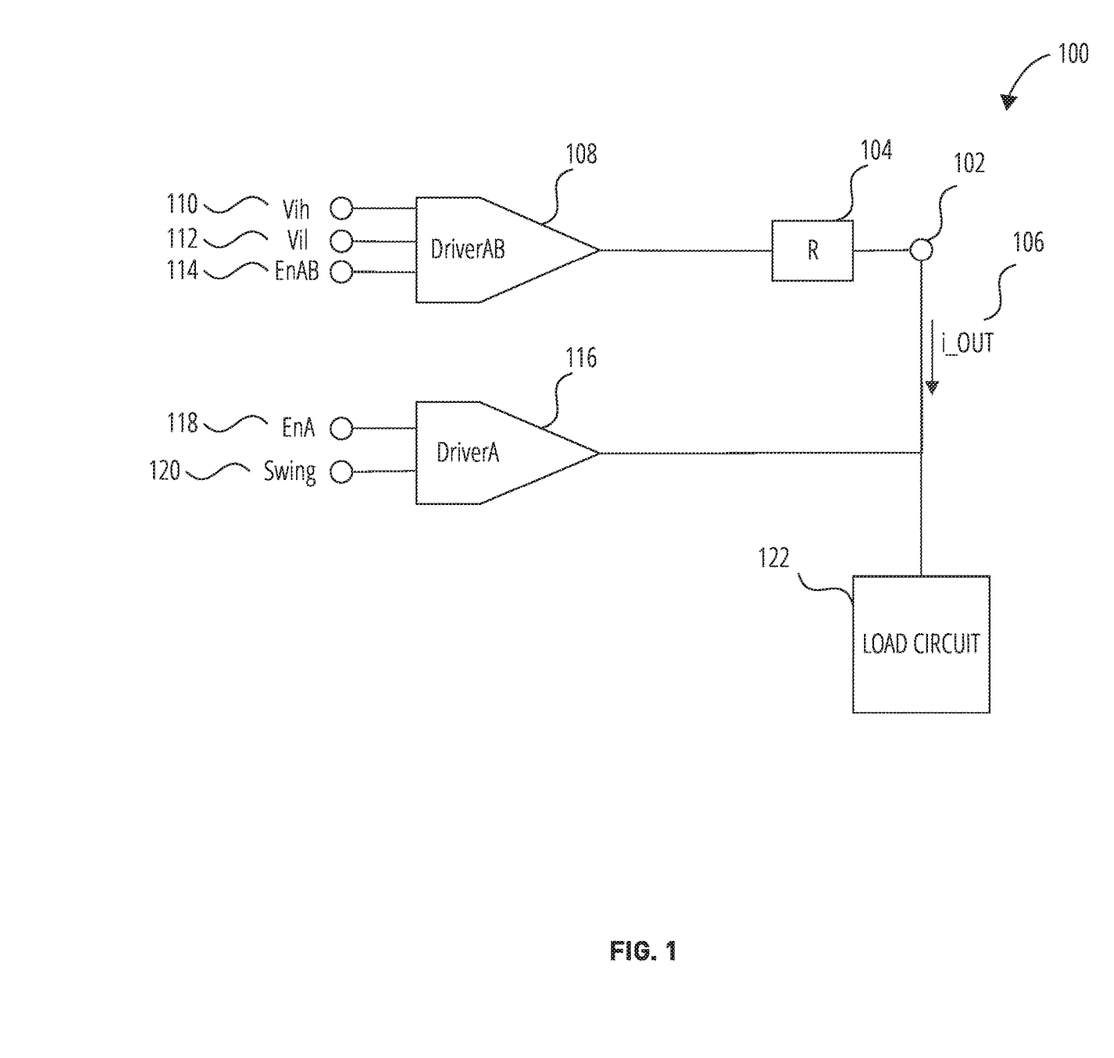
FIG. 1 illustrates generally an example of a test system topology including multiple driver circuits.

FIG. 1 illustrates generally a first example 100 of a test system topology including multiple driver circuits. The first example 100 includes a first DriverAB 108 that can include a class AB driver circuit, and a first DriverA 116 that can include a class A driver circuit. The first example 100 can further include an output element such as a first resistor 104 that can be configured to provide a specified output or load impedance. In an example, the first example 100 can include a first load circuit 122, such as can include a comparator circuit, an active load, or other loading device. In an example, the test system is configured to provide a first output current 106, i_OUT, at a DUT pin 102.

In an example, the first DriverAB 108 can be configured to produce a voltage stimulus signal by selecting between parallel-connected diode bridges with each bridge driven by a unique, dedicated DC voltage level. In the first example 100 of FIG. 1, DC voltages Vih 110 and Vil 112 drive diode bridges in the first DriverAB 108. The switching stage can be followed by a voltage buffering stage that can provide power gain, such as can be used to produce large currents to serve a 50 ohm DUT environment.

In contrast with the first DriverAB 108, the first DriverA 116 can be configured to produce transitions at the DUT pin 102 using a relatively large current switch stage that can be coupled directly to the DUT pin 102. A current switching stage in the first DriverA 116 can alternately switch current into and out of the DUT pin 102 in response to a control signal Swing 120, such as can be a voltage control signal. The first DriverA 116 can provide high speed operation, for example, because it may be unburdened by the class AB voltage buffering stage with its attendant bandwidth limitations and other performance limitations.

In an example, the first DriverA 116 can be configured to provide a relatively low amplitude signal at the DUT pin 102. For example, the first DriverA. 116 can provide a signal having about a 2 volt swing. The first DriverAB 108 can be configured to provide a relatively high amplitude signal at the DUT pin 102, for example, −1.5 to +7 volts. The first DriverA 116 generally operates at a higher switching speed or bandwidth than the first DriverAB 108. In an example, the first DriverAB 108 can be configured to absorb switching currents from the first DriverA 116. That is, the first DriverAB 108 can serve as a buffer that the first DriverA 116 can source current into, such as through the first resistor 104.

A particular one or both of the first DriverAB 108 and the first DriverA 116 can be selected to fulfill disparate DUT test requirements that may not otherwise be fulfilled by a single driver. For example, while both driver circuits can provide DUT waveforms, the first DriverAB 108 can be configured to provide large amplitude, low bandwidth stimulus signals, and the first DriverA 116 can be configured to provide low amplitude, high bandwidth stimulus signals.

In an example, the first DriverAB 108 and the first DriverA 116 do not share an enable pin. Instead, each driver circuit includes an independent enable control through pins EnAB 114 and EnA 118. The independent enable control facilitates the first DriverAB 108 to serve as a low speed, high voltage stimulus source, and to serve as a static, non-transitioning buffer to absorb switching currents from the first DriverA 116.

Figure 2:
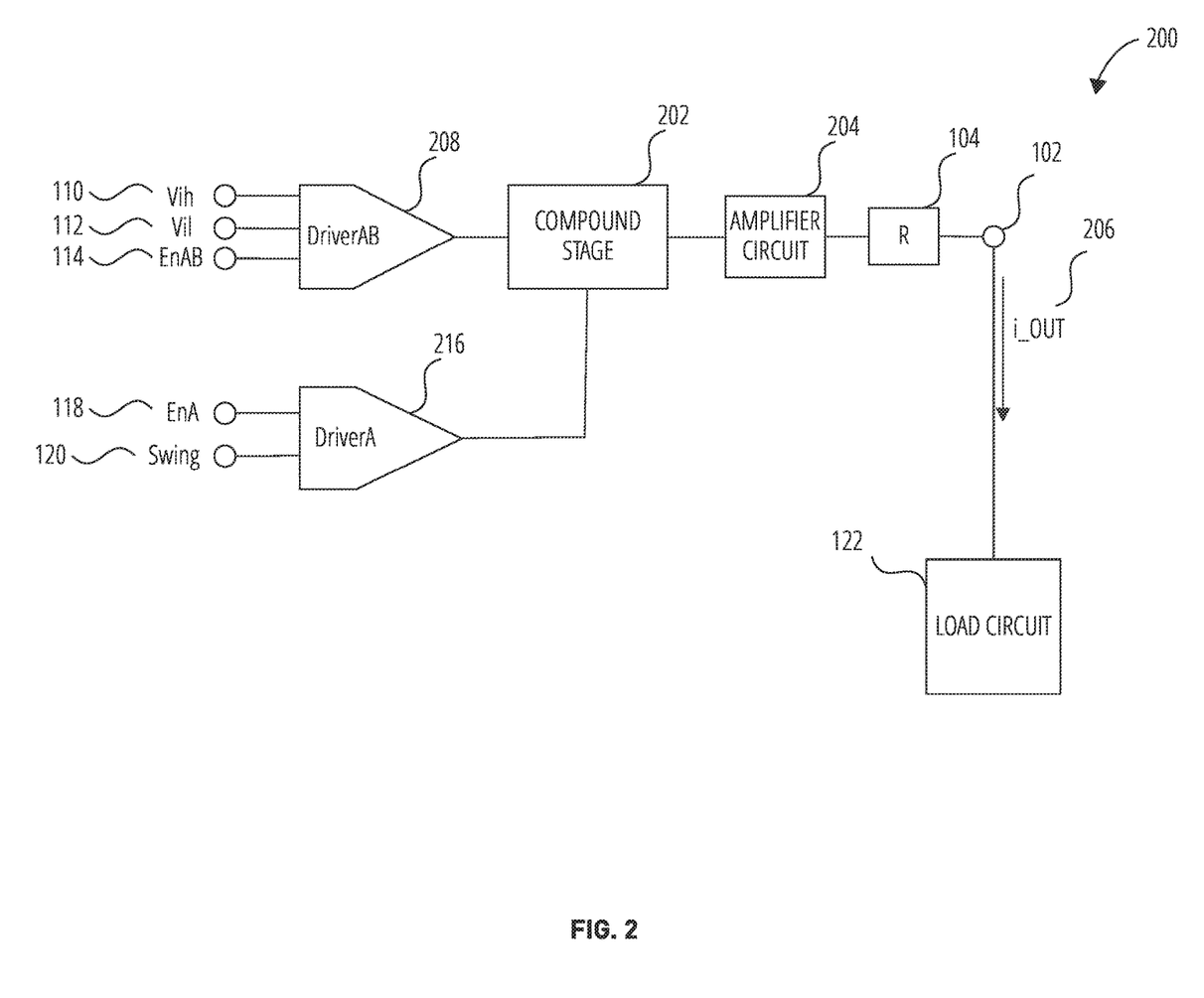
FIG. 2 illustrates generally an example of a test system topology including a compound stage and multiple driver circuits.

FIG. 2 illustrates generally a second example 200 of a test system topology including a compound stage 202 and multiple driver circuits. The second example 200 can include a second DriverAB 208 and a second DriverA 216. In an example, the second DriverAB 208 can be the same or similar device as the first DriverAB 108 and the second DriverA 216 can be the same or similar device as the first DriverA 116 from the example of FIG. 1.

In an example, the second DriverA 216 can be a physically smaller device than the first DriverA 116. For example, the second DriverA 216 can be at least one and optionally multiple orders of magnitude smaller than the first DriverA 116. The second DriverA 216 can be configured to provide signals that have similar timing characteristics but different amplitude characteristics than the first DriverA 116. In an example, the second DriverA 216 can be more cost-effective to manufacture than the first DriverA 116 because it can occupy less die area or can include or use components having more lenient performance requirements.

The second example 200 can further include the first resistor 104, the DUT pin 102, and the first load circuit 122, such as can be the same or similar to the items as described above in the discussion of FIG. 1. That is, the second DriverAB 208 and second DriverA 216 of the second example 200 can be used interchangeably with the drivers from the example of FIG. 1 to provide signals to a DUT via the DUT pin 102, or the second DriverAB 208 and second DriverA 216 can be terminated with the same first resistor 104 or first load circuit 122, as in the example of FIG. 1.

The second example 200 can further include a compound stage 202 and a first amplifier circuit 204. The compound stage 202 can be configured to receive test signals from the second DriverAB 208 and from the second DriverA 216 and, in response, provide signals to the DUT pin 102 via the first amplifier circuit 204. The first amplifier circuit 204 can be configured to buffer or amplify signals from the compound stage 202 for delivery to the DUT pin 102. In an example, the compound stage 202 can concurrently or sequentially receive and respond to signals from the second DriverAB 208 or second DriverA 216.

The compound stage 202 can provide a relatively high input impedance environment for signals received from the second DriverAB 208 or the second DriverA 216. Accordingly, switching signals provided by one or both of the second DriverAB 208 or second DriverA. 216 can be relatively smaller than signals provided by, for example, the first DriverAB 108 or the first DriverA 116 in the first example 100 from FIG. 1. For example, switching current signals from the second DriverA 216 can be one or more orders of magnitude smaller than signals from the first DriverA 116. The compound stage 202 can receive the smaller signals, convert them to voltage signals, and then deliver the signals to the DUT pin 102 via the first amplifier circuit 204. With the second DriverA 216 isolated from the DUT pin 102 by the compound stage 202 and the first amplifier circuit 204, parasitic loading from the second DriverA 216 can be reduced or eliminated and thus cancellation components or other mitigating circuitry can be omitted from the signal path.

Figure 3:
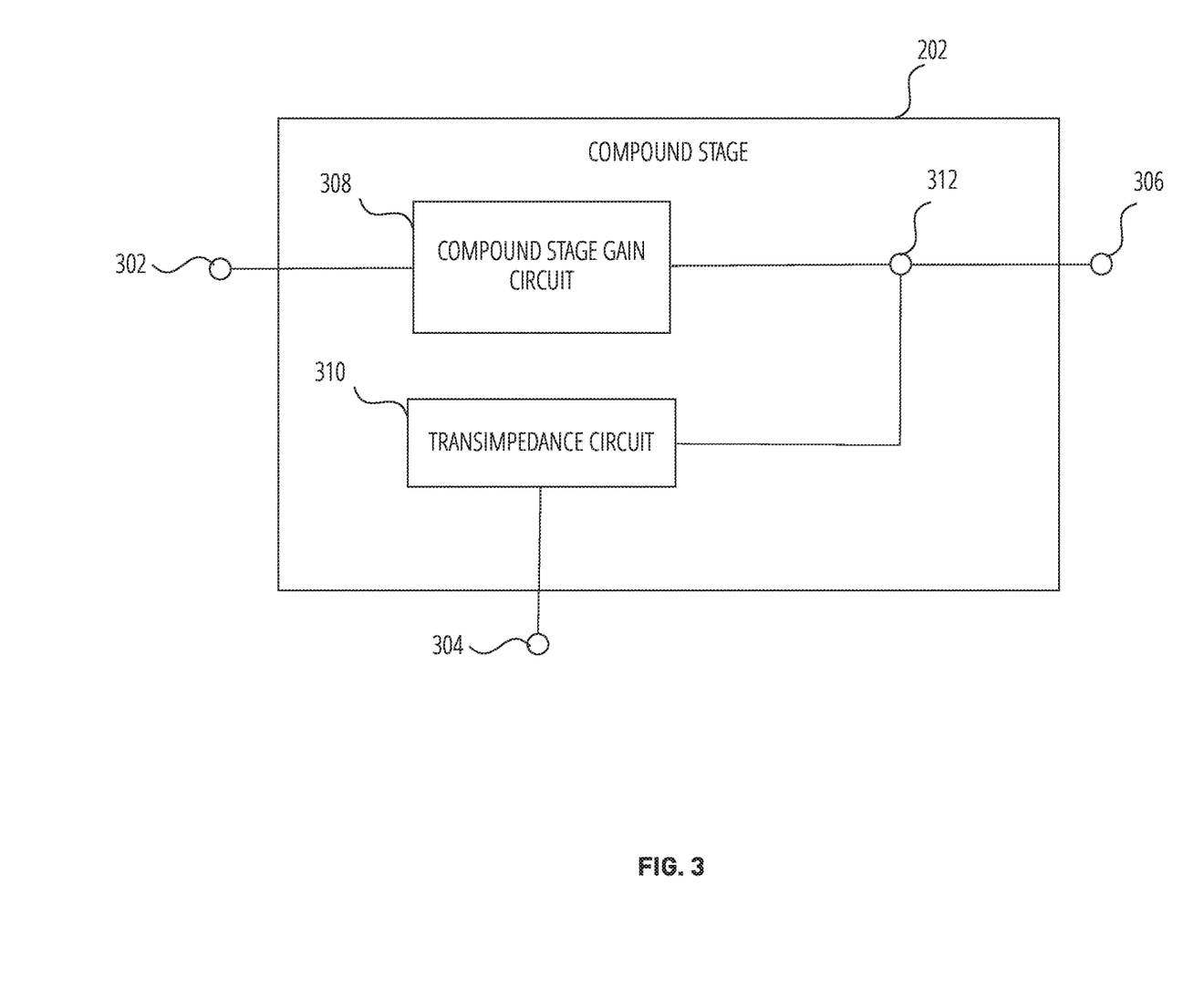
FIG. 3 illustrates generally an example of a block diagram of a compound stage for a test system.

FIG. 3 illustrates generally an example of a block diagram of the compound stage 202. The compound stage 202 can include, among other things, a compound stage gain circuit 308 and a transimpedance circuit 310. The compound stage gain circuit 308 can be configured to receive a first input signal from a voltage input node 302 and the transimpedance circuit 310 can be configured to receive a second input signal from a current input node 304. That is, the compound stage 202 can be configured to receive a voltage input signal at the voltage input node 302, and the compound stage 202 can be configured to receive a current input signal at the current input node 304.

In an example, the compound stage gain circuit 308 can include a buffer circuit or amplifier circuit configured to receive one or more signals from the second DriverAB 208 using the voltage input node 302. In response to signals at the voltage input node 302, the compound stage gain circuit 308 can provide a first portion of an output signal at a summing node 312. In an example, the compound stage gain circuit 308 can include a pass-through voltage buffer that provides a signal that is substantially the same in amplitude, duration, frequency, phase, or other characteristic, as a signal received from the second DriverAB 208 at the voltage input node 302.

In an example, the transimpedance circuit 310 can include a circuit configured to receive one or more signals from the second DriverA 216 using the current input node 304. In response to current signals received at the current input node 304, the transimpedance circuit 310 can provide a second portion of an output signal at the summing node 312. That is, the transimpedance circuit 310 can receive current signals and, in response, provide corresponding voltage signals. In an example, the transimpedance circuit 310 can be configured to receive a current signal at the current input node 304 and then provide a voltage signal having amplitude, duration, frequency, phase, or other signal characteristics that correspond to or depend on the characteristics of the received current signal.

In an example, the summing node 312 receives the first portion of the output signal from the compound stage gain circuit 308 and receives the second portion of the output signal from the transimpedance circuit 310. The summing node 312 can include a node or circuit configured to combine or sum the signal portions together to provide an output signal that is a superposition of the first portion and the second portion of the output signal. Other signals can similarly be superposed or combined at the summing node 312. The compound stage 202 can provide an output signal from the summing node 312 at the compound stage output node 306, for example, to the first amplifier circuit 204. For example, the first amplifier circuit 204 can receive a superposition signal comprising the first and second portions of the voltage output signal from the compound stage output node 306 and, in response, provide a test signal to the first resistor 104 or to the DUT pin 102.

Figure 4:
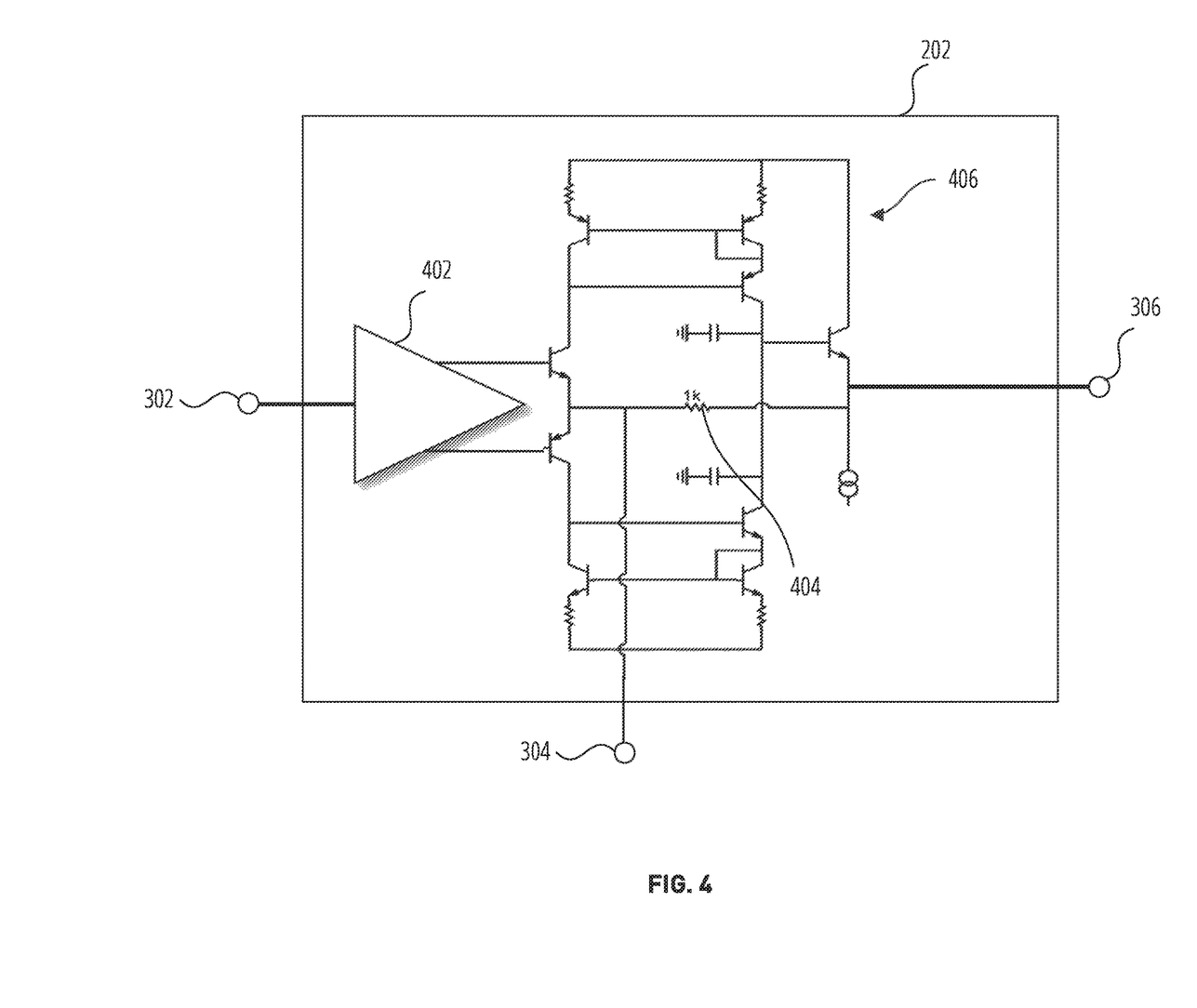
FIG. 4 illustrates generally an example of a schematic diagram of a portion of a compound stage for a test system.

FIG. 4 illustrates generally an example of a schematic diagram of the compound stage 202. In an example, the schematic diagram of the compound stage 202 can include or represent components that can be used in the compound stage gain circuit 308 or the transimpedance circuit 310 from the block diagram example of FIG. 3.

In the example of FIG. 4, the compound stage 202 includes a compound stage amplifier circuit 402 configured to receive voltage signals from the voltage input node 302. The compound stage amplifier circuit 402, in response to signals at the voltage input node 302, can provide corresponding voltage signals to a feedback network 406 that is coupled between the compound stage amplifier circuit 402 and the compound stage output node 306. In an example, the compound stage amplifier circuit 402 and/or the feedback network 406 can be configured to provide a signal at the compound stage output node 306 that can include a substantially 1:1 representation of a signal received at the voltage input node 302. The various components of the feedback network 406 are illustrated as an example, and other configurations or components can be used, for example, to similarly enhance a bandwidth characteristic of the compound stage 202.

In the example of FIG. 4, the compound stage 202 includes a transimpedance resistor 404. The transimpedance resistor 404 can be coupled to the current input node 304 and can be configured to receive current input signals from, for example, the second DriverA 216. In an example, the transimpedance resistor 404 can have a fixed resistance characteristic, such as 1 kOhm. In an example, the transimpedance resistor 404 can have a variable or selectable resistance characteristic that can be determined based on, for example, a magnitude or other characteristic of signals received from the current input node 304. The transimpedance resistor 404 can be used to receive the current input signals and convert them to voltage signals that can be combined with other voltage signals from the compound stage amplifier circuit 402 or the voltage input node 302, such as using the feedback network 406 or using another circuit configured to combine the signals. In an example, the feedback network 406 can be configured to reduce an apparent input impedance characteristic of the compound stage 202 at the current input node 304, for example, to be less than an impedance characteristic of the transimpedance resistor 404.

Figure 5:
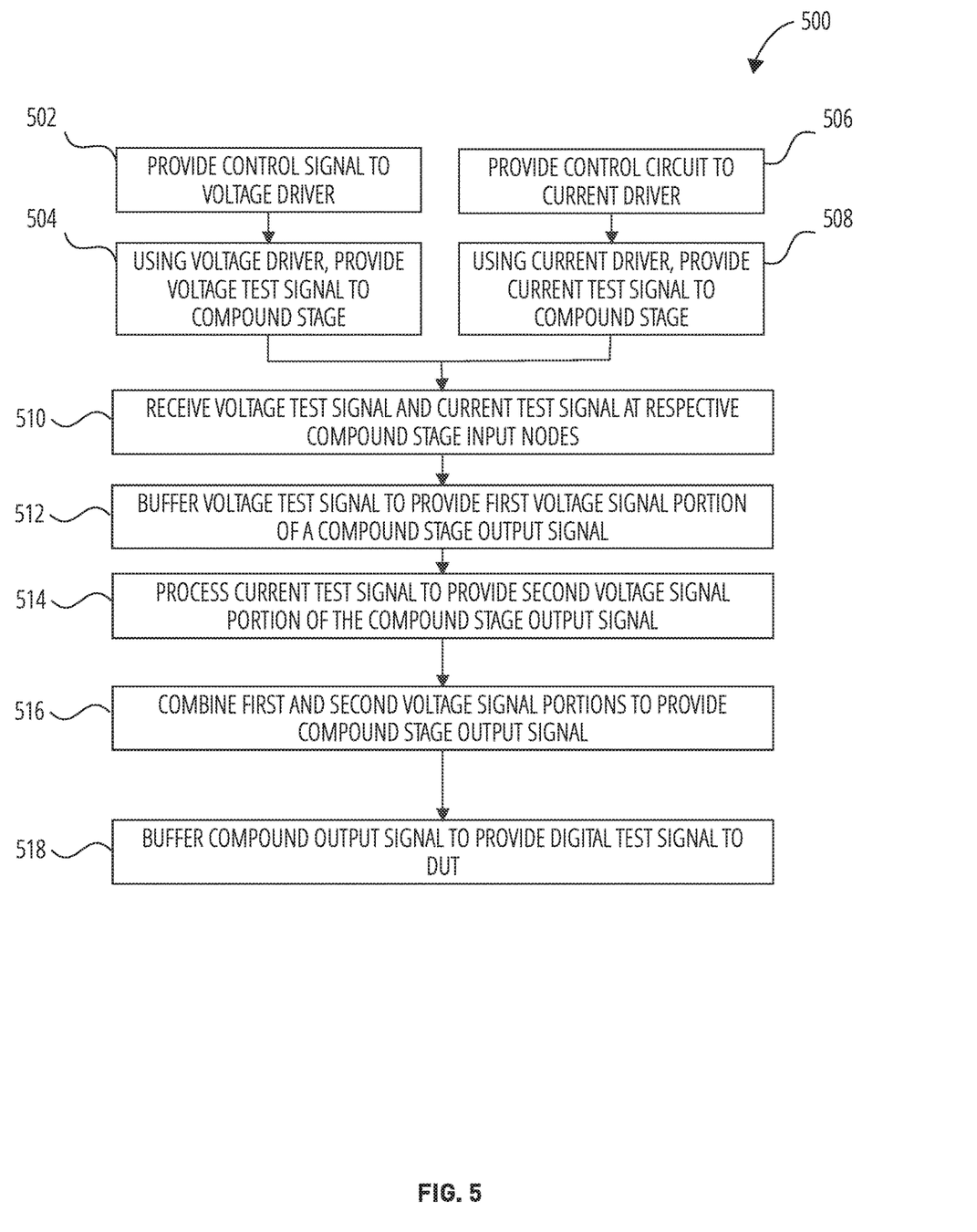
FIG. 5 illustrates generally an example of a method that can include using a compound stage in a test system to provide a test signal to a DUT.

FIG. 5 illustrates generally an example of a method 500 that can include using a compound stage in a test system to provide a test signal to a DUT. In an example, the method 500 can include or use the compound stage 202 from the examples of FIG. 2, FIG. 3, or FIG. 4. The compound stage in the example of the method 500 can be configured to receive respective voltage and current stimulus signals, convert the current stimulus signal to a voltage, and combine the voltage signals to provide a voltage output signal to a DUT.

At block 502, the method 500 can include providing a control signal to a voltage driver. Block 502 can include or use a timing controller or other control circuit to issue control signals to a voltage driver, such as to the second DriverAB 208. In an example, block 502 can include using the timing controller to provide the Vih 110 and Vil 112 signals to the second DriverAB 208 at different respective and non-overlapping times. In response to the control signal provided at block 502, the method 500 can continue at block 504 and use a voltage driver to provide a voltage test signal to a compound stage. For example, block 504 can include using the second DriverAB 208 to provide a voltage test signal, or a plurality of voltage test signals, to the compound stage 202.

At block 506, the method 500 can include providing a control signal to a current driver. Block 506 can include or use the same or different timing controller or other control circuit to issue control signals to the current driver, such as to the second DriverA 216. In an example, block 506 can include using the timing controller to provide the control signal Swing 120 to the second DriverA 216. In response to the control signal provided at block 506, the method 500 can continue at block 508 and use a current driver to provide a current test signal to the compound stage. For example, block 508 can include using the second DriverA 216 to provide a current test signal, or a plurality of current test signals, to the compound stage 202. In an example, the control signals provided in block 502 and block 506 can be provided substantially concurrently such that the voltage test signals provided in block 504 and the current test signals provided in block 508 can be provided substantially sequentially or can be provided substantially concurrently. In other words, the voltage test signals can be provided to the compound stage at different times or at the same times as current test signals are provided to the compound stage.

At block 510, the compound stage can receive one or more voltage test signals from block 504 and the compound stage can receive one or more current test signals from block 508. The various voltage and current signals can have different non-overlapping arrival times and durations, or the signals can overlap or can be received concurrently. The one or more voltage test signals can be received at the voltage input node 302 of the compound stage 202 and the one or more current test signals can be received at the current input node 304 of the compound stage 202.

Block 512 and block 514 can be performed substantially concurrently or can be performed sequentially or at different times. At block 512, the method 500 can include buffering a voltage test signal received at the compound stage at block 510 and, in response, providing a first voltage signal portion of a compound stage output signal. Buffering the voltage test signal at block 512 can include using one or more of the compound stage gain circuit 308, the compound stage amplifier circuit 402, or the feedback network 406 of the compound stage 202.

At block 514, the method 500 can include processing a current test signal received at the compound stage at block 510 and, in response, providing a second voltage signal portion of the compound stage output signal. Processing the current test signal at block 514 can include using a transimpedance device or circuit, such as using the transimpedance circuit 310 or the transimpedance resistor 404 of the compound stage 202.

At block 516, the method 500 can include combining the first and second voltage signal portions from block 512 and block 514 to provide a compound stage output signal. In an example, the first and second voltage signal portions can be summed or superimposed, for example at the summing node 312, to provide the compound stage output signal. At block 518, the compound stage output signal can be buffered or amplified, such as using the first amplifier circuit 204, and provided to a DUT, such as to the DUT pin 102.

In an example, as mentioned previously, a problem to be solved includes providing a test signal generator system that is relatively small, inexpensive to produce, consumes less power than traditional systems, or provides higher fidelity performance relative to traditional systems. For example, the problem can include providing a test signal generator with improved pulse edge placement accuracy or improved bandwidth characteristics. Various aspects of the present disclosure can help provide a solution to these and other problems associated with test systems.

In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a compound stage circuit for a pin driver system, the compound stage circuit responsive to input signals from at least a first driver and a second driver, and the compound stage circuit is configured to provide, at a compound stage output node, an output voltage signal to an output gain stage. In Aspect 1, the compound stage circuit can include a voltage input node configured to receive an input voltage signal from the first driver, a current input node configured to receive an input current signal from the second driver, a first gain circuit configured to receive the input voltage signal at the voltage input node and provide, based on the input voltage signal, a first portion of the output voltage signal at the compound stage output node, and a transimpedance circuit configured to receive the input current signal at the current input node and provide, based on the input current signal, a second portion of the output voltage signal at the compound stage output node. In Aspect 1, the first and second portions of the output voltage signal can be superimposed at the compound stage output node to provide the output voltage signal.

Aspect 2 can include or use, or can optionally be combined with the subject matter of Aspect 1, to optionally include the transimpedance circuit comprising a resistor coupled in series between the current input node and the compound stage output node.

Aspect 3 can include or use, or can optionally be combined with the subject matter of Aspect 2, to optionally include the first gain circuit comprising a feedback network configured to reduce an apparent input impedance of the current input node to be less than an impedance characteristic of the resistor.

Aspect 4 can include or use, or can optionally be combined with the subject matter of one or any combination of Aspects 1 through 3 to optionally include or use the output gain stage configured to provide a test signal to a device under test (DUT) via an output resistor, wherein the test signal is based on the output voltage signal at the compound stage output node.

Aspect 5 can include or use, or can optionally be combined with the subject matter of one or any combination of Aspects 1 through 4 to optionally include or use the first gain circuit comprising a feedback network configured to enhance a bandwidth characteristic of the compound stage circuit.

Aspect 6 can include or use, or can optionally be combined with the subject matter of Aspect 5, to optionally include the first gain circuit configured to provide the first portion of the output voltage signal with substantially the same magnitude and phase as the input voltage signal from the first driver.

Aspect 7 can include or use, or can optionally be combined with the subject matter of one or any combination of Aspects 1 through 6 to optionally include or use the first driver comprising a Class AB driver configured to provide voltage test signals at a first speed, and the second driver comprising a Class A driver configured to provide current test signals at a second speed that is less than the first speed.

Aspect 8 can include or use, or can optionally be combined with the subject matter of one or any combination of Aspects 1 through 7 to optionally include the voltage input node configured to receive the input voltage signal from the first driver in response to first control signals from a control circuit, and the current input node is configured to receive the input current signal from the second driver in response to second control signals from the control circuit. In Aspect 8, the control circuit can assert the first and second control signals concurrently.

Aspect 9 can include or use, or can optionally be combined with the subject matter of one or any combination of Aspects 1 through 8 to optionally include the first and second portions of the output voltage signal superimposed, or combined, at the compound stage output node using a summing circuit.

Aspect 10 can include or use, or can optionally be combined with the subject matter of one or any combination of Aspects 1 through 9 to optionally include the first gain circuit coupled to the transimpedance circuit at the compound stage output node.

Aspect 11 can include or use subject matter (such as an apparatus, a system, a device, a method, a means for performing acts, or a device readable medium including instructions that, when performed by the device, can cause the device to perform acts, or an article of manufacture), such as can include or use a driver circuit for providing a test signal to a device under test (DUT). In Aspect 11, the driver circuit comprises a voltage buffer circuit configured to provide a first voltage output signal at an intermediate output node in response to an input voltage signal from a first driver stage, and a transimpedance circuit configured to provide a second voltage output signal at the intermediate output node in response to an input current signal from a different second driver stage, and an amplifier circuit configured to receive, from the intermediate output node, a combination signal comprising a superposition of the first and second voltage output signals and, in response to the combination signal, provide an output signal to the DUT.

Aspect 12 can include or use, or can optionally be combined with the subject matter of Aspect 11, to optionally include or use the first driver stage to provide the input voltage signal, and to include or use the second driver stage to provide the input current signal.

Aspect 13 can include or use, or can optionally be combined with the subject matter of Aspect 12, to optionally include the first driver stage configured to provide the input voltage signal at two or more discrete and non-zero signal levels, and include the second driver stage to provide the input current signal at two or more discrete non-zero signal levels.

Aspect 14 can include or use, or can optionally be combined with the subject matter of one or any combination of Aspects 12 or 13 to optionally include or use a control circuit configured to provide signal magnitude and signal timing instructions to each of the first and second driver stages.

Aspect 15 can include or use, or can optionally be combined with the subject matter of one or any combination of Aspects 12 through 14 to optionally include or use the first driver stage to provide a relatively low speed signal as the input voltage signal. In Aspect 15, the second driver stage can be configured to provide a relatively high speed signal as the input current signal.

Aspect 16 can include or use subject matter (such as an apparatus, a system, a device, a method, a means for performing acts, or a device readable medium including instructions that, when performed by the device, can cause the device to perform acts, or an article of manufacture), such as can include or use a method for providing a digital test signal to a device under test (DUT), In Aspect 16, the method can include providing a voltage test signal to a voltage input node, providing a current test signal to a current input node, buffering the voltage test signal to provide a first voltage signal portion of a compound output signal, processing the current test signal to provide a second voltage signal portion of the compound output signal, wherein the compound output signal comprises a combination of the first and second voltage signal portions, and buffering the compound output signal to provide the digital test signal to the DUT.

Aspect 17 can include or use, or can optionally be combined with the subject matter of Aspect 16, to optionally include processing the current test signal, including using a transimpedance circuit to receive the current test signal and, in response, provide the first voltage signal portion of the compound output signal.

Aspect 18 can include or use, or can optionally be combined with the subject matter of one or any combination of Aspects 16 or 17 to optionally include buffering the compound output signal using an amplifier circuit.

Aspect 19 can include or use, or can optionally be combined with the subject matter of one or any combination of Aspects 16 through 18 to optionally include providing the voltage test signal using a first driver circuit belonging to a first class of signal driver, and providing the current test signal using a second driver circuit belonging to a different second class of signal driver.

Aspect 20 can include or use, or can optionally be combined with the subject matter of one or any combination of Aspects 16 through 19 to optionally include providing timing and/or magnitude control signals to the first and second driver circuits and, in response, using the first and second driver circuits to provide the voltage test signal and the current test signal respectively.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. The present inventor contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more," En this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein,"

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A compound stage circuit for a pin driver system, the compound stage circuit responsive to respective input signals from at least a first driver and a second driver, and the compound stage circuit is configured to provide, at a compound stage output node, an output voltage signal to an output gain stage, the compound stage circuit comprising:
   a voltage input node configured to receive an input voltage signal from the first driver;
   a current input node configured to receive an input current signal from the second driver;
   a first gain circuit configured to receive the input voltage signal at the voltage input node and provide, based on the input voltage signal, a first portion of the output voltage signal at the compound stage output node; and
   a transimpedance circuit configured to receive the input current signal at the current input node and provide, based on the input current signal, a second portion of the output voltage signal at the compound stage output node;
   wherein the first and second portions of the output voltage signal are combined at the compound stage output node to provide the output voltage signal.

2. The compound stage circuit of claim 1, wherein the transimpedance circuit comprises a resistor or resistance coupled in series between the current input node and the compound stage output node.

3. The compound stage circuit of claim 2, wherein the first gain circuit comprises a feedback network configured to provide an apparent input impedance of the current input node that is less than an impedance characteristic of the resistor or resistance.

4. The compound stage circuit of claim 1, further comprising the output gain stage configured to provide a test signal to a device under test (DUT) via an output resistor, wherein the test signal is based on the output voltage signal at the compound stage output node.

5. The compound stage circuit of claim 1, wherein the first gain circuit comprises a feedback network configured to establish a bandwidth characteristic of the compound stage circuit.

6. The compound stage circuit of claim 5, wherein the first gain circuit is configured to provide the first portion of the output voltage signal with magnitude and phase characteristics corresponding to those of the input voltage signal from the first driver.

7. The compound stage circuit of claim 1, wherein the first driver comprises a Class AB driver configured to provide voltage test signals at a first speed, and wherein the second driver comprises a Class A driver configured to provide current test signals at a second speed that is less than the first speed.

8. The compound stage circuit of claim 1, wherein the voltage input node is configured to receive the input voltage signal from the first driver in response to first control signals from a control circuit, and wherein the current input node is configured to receive the input current signal from the second driver in response to second control signals from the control circuit, wherein the control circuit asserts the first and second control signals at least in part concurrently.

9. The compound stage circuit of claim 1, wherein the first and second portions of the output voltage signal are superimposed at the compound stage output node using a summing circuit.

10. The compound stage circuit of claim 1, wherein the first gain circuit is coupled to the transimpedance circuit at the compound stage output node.

11. A driver circuit for providing a test signal to a device under test (DUT), the driver circuit comprising:
- a voltage buffer circuit configured to provide a first voltage output signal at an intermediate output node in response to an input voltage signal from a first driver stage;
- a transimpedance circuit configured to provide a second voltage output signal at the intermediate output node in response to an input current signal from a different second driver stage; and
- an amplifier circuit configured to receive, from the intermediate output node, a combination signal comprising a superposition of the first and second voltage output signals and, in response to the combination signal, provide an output signal to the DUT.

12. The driver circuit of claim 11, further comprising the first driver stage configured to provide the input voltage signal, and the second driver stage configured to provide the input current signal.

13. The driver circuit of claim 12, wherein the first driver stage is configured to provide the input voltage signal at two or more discrete and non-zero signal levels, and wherein the second driver stage is configured to provide the input current signal at two or more discrete non-zero signal levels.

14. The driver circuit of claim 12, further comprising a control circuit configured to provide a signal magnitude instruction and a signal timing instruction to each of the first and second driver stages.

15. The driver circuit of claim 12, wherein the first driver stage is configured to provide a relatively lower speed signal as the input voltage signal, and
wherein the second driver stage is configured to provide a relatively higher speed signal as the input current signal.

16. A method for providing a digital test signal to a device under test (DUT), the method comprising:
- providing a voltage test signal to a voltage input node;
- providing a current test signal to a current input node;
- buffering the voltage test signal to provide a first voltage signal portion of a compound output signal;
- processing the current test signal to provide a second voltage signal portion of the compound output signal, wherein the compound output signal comprises a combination of the first and second voltage signal portions; and
- buffering the compound output signal to provide the digital test signal to the DUT.

17. The method of claim 16, wherein processing the current test signal includes using a transimpedance circuit to receive the current test signal and, in response, provide the first voltage signal portion of the compound output signal.

18. The method of claim 16, wherein buffering the compound output signal includes amplifying the compound output signal.

19. The method of claim 16, wherein providing the voltage test signal includes using a first class AB driver circuit, and wherein providing the current test signal includes using a different second class A driver circuit.

20. The method of claim 19, further comprising providing at least one of a timing control signal or a magnitude control signal to the first and second driver circuits respectively and, in response, using the first and second driver circuits to provide the voltage test signal and the current test signal respectively.

* * * * *